(12) United States Patent
Nakahara et al.

(10) Patent No.: US 10,971,424 B2
(45) Date of Patent: Apr. 6, 2021

(54) POWER MODULE AND POWER CONVERTOR

(71) Applicant: Mitsubishi Electric Corporation, Tokyo (JP)

(72) Inventors: Kenta Nakahara, Tokyo (JP); Yoshihiro Yamaguchi, Tokyo (JP); Fumihito Kawahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/208,620

(22) Filed: Dec. 4, 2018

(65) Prior Publication Data

US 2019/0252289 A1    Aug. 15, 2019

(30) Foreign Application Priority Data

Feb. 9, 2018    (JP) ................. 2018-021970

(51) Int. Cl.
*H01L 23/373* (2006.01)
*H01L 23/367* (2006.01)
(Continued)

(52) U.S. Cl.
CPC ........ *H01L 23/3735* (2013.01); *H01L 23/043* (2013.01); *H01L 23/13* (2013.01); *H01L 23/24* (2013.01); *H01L 23/367* (2013.01); *H01L 24/48* (2013.01); *H01L 25/072* (2013.01); H01L 24/29 (2013.01); H01L 24/32 (2013.01); H01L 24/73 (2013.01); H01L 24/83 (2013.01);
(Continued)

(58) Field of Classification Search
CPC ........ H01L 2224/32225; H01L 25/075; H01L 25/072; H01L 23/3735; H01L 24/73; H01L 2924/014; H01L 2924/00012; H01L 2224/45099; H01L 23/13; H01L 24/83; H01L 2924/00014; H01L 2224/73265; H01L 2224/83801; H01L 24/48; H01L 2224/48227; H01L 2224/48091

See application file for complete search history.

(56) References Cited

U.S. PATENT DOCUMENTS

| 9,236,316 B2* | 1/2016 | Fujino ................... H01L 23/495 |
| 2012/0080800 A1* | 4/2012 | Shinohara ............... H01L 23/24 257/773 |

(Continued)

FOREIGN PATENT DOCUMENTS

| DE | 102015105575 A1 | 10/2015 |
| JP | 2015-128154 A | 7/2015 |

(Continued)

OTHER PUBLICATIONS

An Office Action mailed by the German Patent and Trade Mark Office dated Feb. 4, 2021, which corresponds to German Patent Application No. DE 10 2019 200 884.4.

*Primary Examiner* — Jasmine J Clark
(74) *Attorney, Agent, or Firm* — Studebaker & Brackett PC

(57) ABSTRACT

A power module includes a recessed base plate having a hollow portion, at least one insulating substrate disposed in the hollow portion of the base plate, at least one semiconductor chip mounted on the at least one insulating substrate, and sealing resin for sealing a surface of the hollow portion side of the base plate, the at least one insulating substrate, and the at least one semiconductor chip.

13 Claims, 4 Drawing Sheets

(51) Int. Cl.
  *H01L 23/13*  (2006.01)
  *H01L 23/00*  (2006.01)
  *H01L 23/043* (2006.01)
  *H01L 23/24*  (2006.01)
  *H01L 25/07*  (2006.01)

(52) U.S. Cl.
  CPC .............. *H01L 2224/29101* (2013.01); *H01L 2224/32225* (2013.01); *H01L 2224/48091* (2013.01); *H01L 2224/48227* (2013.01); *H01L 2224/73265* (2013.01); *H01L 2224/83801* (2013.01); *H01L 2924/00014* (2013.01); *H01L 2924/151* (2013.01); *H01L 2924/181* (2013.01)

(56) References Cited

U.S. PATENT DOCUMENTS

| | | |
|---|---|---|
| 2013/0135824 A1 | 5/2013 | Harubeppu et al. |
| 2014/0048918 A1* | 2/2014 | Nagaune ............. H01L 23/4334 257/675 |
| 2015/0021750 A1* | 1/2015 | Fujino .................... H01L 23/24 257/667 |
| 2015/0069601 A1* | 3/2015 | Yamaguchi ........... H01L 21/566 257/734 |
| 2015/0294931 A1 | 10/2015 | Brucchi et al. |
| 2017/0275453 A1* | 9/2017 | Nakamata ............ C08G 59/226 |

FOREIGN PATENT DOCUMENTS

| | | |
|---|---|---|
| JP | 2016-181549 A | 10/2016 |
| JP | 2016-195224 A | 11/2016 |

* cited by examiner

POWER MODULE AND POWER CONVERTOR

BACKGROUND OF THE INVENTION

Field of the Invention

The present invention relates to a technology for improving heat dissipation of a power module, and for improving reliability of the power module by reducing a stress.

Description of the Background Art

Hitherto, AlSiC is often used as a base plate of a power module for a railway vehicle in view of mechanical characteristics. As a major structure of the power module, an insulating substrate and a base plate are joined by solder.

In order to drastically improve heat dissipation of the power module, members used in the power module need to be changed. Since the power module for a railway vehicle employs the structure in which the insulating substrate and the base plate are joined by solder, it is important to control deflection of the base plate. This results from a fact that, when the material of the base plate is changed from AlSiC to a metal material such as copper and aluminium, a linear expansion coefficient of the base plate is increased from $7 \times 10^{-6}/°$ C. to $15 \times 10^{-6}/°$ C. or more, i.e., the linear expansion coefficient is doubled or more than doubled, to increase a stress generated due to a difference between linear expansion coefficients of the base plate and the sealing resin. A larger stress causes the base plate to be deflected into a recessed shape and the deflected amount becomes larger. Thus, there has been a problem in that reliability and heat dissipation of the power module disadvantageously are reduced.

As a technology of reducing such a stress, for example, Japanese Patent Application Laid-Open No. 2016-195224 discloses a configuration in which a groove is formed in a base plate at an outer peripheral portion of a position where an insulating substrate is disposed. This configuration distributes a stress applied to an end portion of the insulating substrate.

However, in the technology described in Japanese Patent Application Laid-Open No. 2016-195224, although a groove is formed in the base plate at an outer peripheral portion of a position where the insulating substrate is disposed, the insulating substrate is disposed on a pedestal-shaped portion of the base plate and the entire base plate has a flat shape. This causes the base plate to be deflected into a recessed shape and the deflected amount becomes larger. Thus, there has been a problem in that reliability and heat dissipation of the power module are disadvantageously reduced.

SUMMARY

The present invention has an object to provide a technology capable of improving reliability and heat dissipation of a power module.

According to the present invention, a power module includes a recessed base plate, at least one insulating substrate, at least one semiconductor chip, and sealing resin. The base plate has a hollow portion. The at least one insulating substrate is disposed in the hollow portion of the base plate. The at least one semiconductor chip is mounted on the at least one insulating substrate. The sealing resin seals a surface of the hollow portion side of the base plate, the at least one insulating substrate, and the at least one semiconductor chip.

Deflection of the base plate can be mended into a projecting shape, and therefore the deflected amount is less liable to be increased. With this, reliability and heat dissipation of the power module can be improved.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
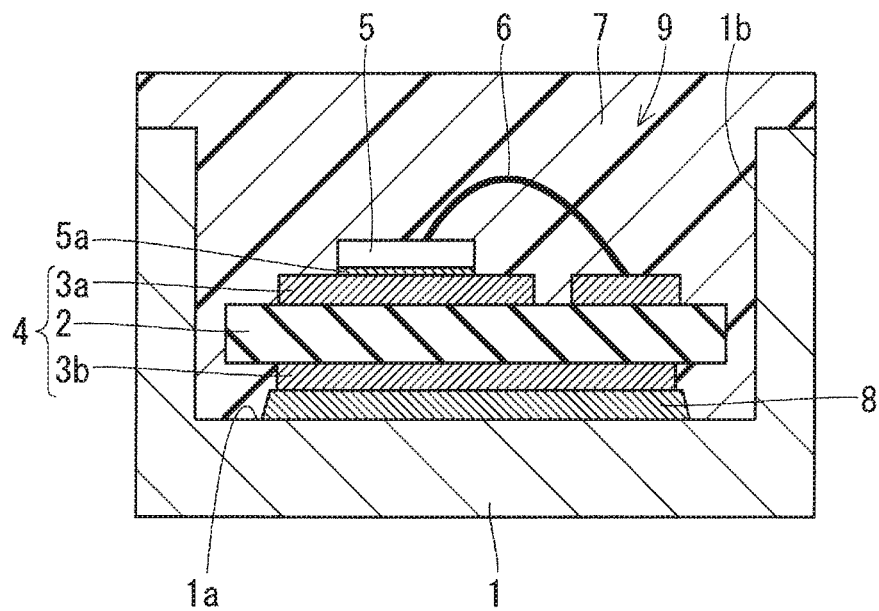
FIG. 1 is a cross-sectional view of a power module according to a first preferred embodiment.
Figure 2:
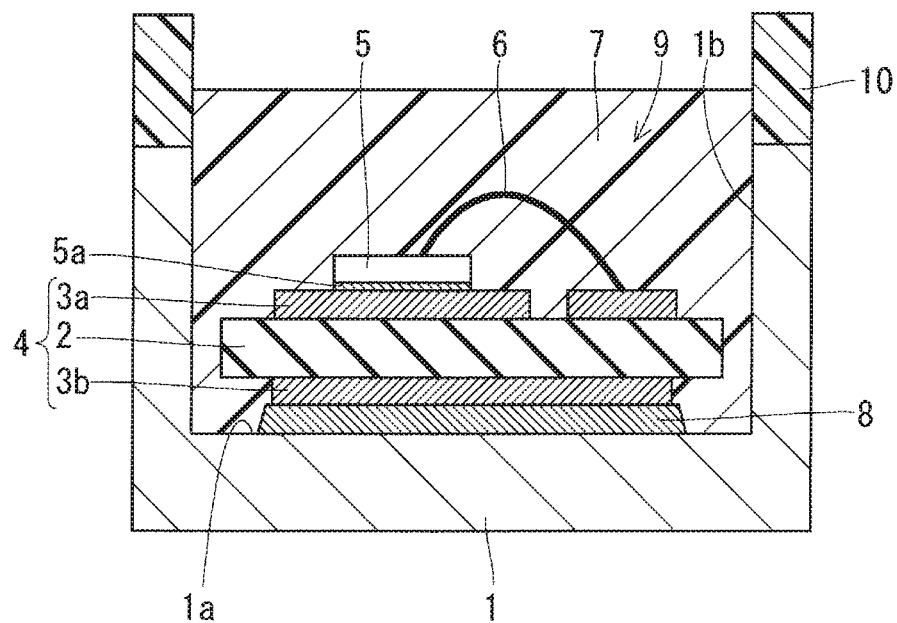
FIG. 2 is a cross-sectional view of a power module according to a modification of the first preferred embodiment.

A first preferred embodiment of the present invention will be described below with reference to the drawings. FIG. 1 is a cross-sectional view of a power module 202 according to a first preferred embodiment. FIG. 2 is a cross-sectional view of a power module 202A according to a modification of the first preferred embodiment.

As illustrated in FIG. 1, the power module 202 is a semiconductor device for a railway vehicle, for example. The power module 202 includes a base plate 1, an insulating substrate 4, a semiconductor chip 5, and sealing resin 7.

The base plate 1 is formed into a recessed shape having a hollow portion 9. The hollow portion 9 has a bottom surface 1a, and a side surface 1b that surrounds the bottom surface 1a. For example, the recessed base plate 1 is formed by performing cutting or pressing with use of a die or the like on a rectangular-cuboid base plate made of copper as a material.

The insulating substrate 4 is disposed in the hollow portion 9 of the base plate 1 through intermediation of solder 8. The insulating substrate 4 includes a ceramic substrate 2, and metal patterns 3a and 3b respectively formed on an upper surface and a lower surface of the ceramic substrate 2. The ceramic substrate 2 may be a substrate made of an insulating material other than a ceramic. Further, the metal patterns 3a and 3b may form a circuit pattern.

Note that, as illustrated in FIG. 2, the power module 202A may further include a case 10. The case 10 is fixed onto an upper end of an outer peripheral portion of the base plate 1 by a method such as fitting.

The semiconductor chip 5 is mounted on an upper surface of the insulating substrate 4. More specifically, the semiconductor chip 5 is mounted on an upper surface of the metal pattern 3a with intermediation of solder 5a. The semiconductor chip 5 and the metal pattern 3a are connected via a wire 6.

The sealing resin 7 is an epoxy resin, and seals a surface of the hollow portion 9 side of base plate 1, the insulating substrate 4, and the semiconductor chip 5. A linear expansion coefficient of the sealing resin 7 is $13 \times 10^{-6}/°$ C. or more.

The hollow portion 9 of the base plate 1 has a depth equal to or more than a half of the thickness of the insulating substrate 4, and equal to or more than ¼ of the thickness of the base plate 1. When the lateral sides of the insulating substrate 4 are surrounded by the outer peripheral portion of the base plate 1, the amount of the sealing resin 7 present at the lateral sides of the insulating substrate 4 is reduced, and thus a stress to the insulating substrate 4 and the solder 8 can be reduced. Here, the thickness of the base plate 1 refers to the thickness of the peripheral portion of the base plate 1 from an upper end to a lower end. Note that, it is preferable that the depth of the hollow portion 9 of the base plate 1 be 1 mm or more.

Next, the effects of the power module 202 will be described through a comparison with a case of employing a normally used flat base plate.

In order to seal with the sealing resin 7, the sealing resin 7 is shaped with a jig or the like. As a method of shaping with a jig, a process such as transfer molding is assumed. When the flat base plate and the insulating substrate 4 are soldered and then sealed by the sealing resin 7, the base plate is deflected into a recessed shape and the deflected amount becomes larger, thus being unqualified as a product.

TABLE 1

|  | Flat base plate | Recessed base plate |
| --- | --- | --- |
| Deflected amount of base plate | −0.81 mm | +0.08 mm |
| Stress to ceramic portion | 430 MPa | 204 MPa |
| Stress to solder joining portion | 500 MPa | 224 MPa |

The inventors of the present application conducted an analysis with simulations to find out that, as shown in Table 1, deflection of the flat base plate was −0.81 mm, that is, the base plate was deflected by 0.81 mm in a recessed direction. In this case, a stress to a ceramic portion was 430 MPa, and a stress to a solder joining portion was 500 MPa. Table 1 shows an analysis result obtained by the simulations. Note that, the ceramic portion refers to the insulating substrate 4, and the solder joining portion refers to the solder 8.

In view of this, the recessed base plate 1 having the hollow portion 9 is employed. With this, the base plate 1 can shift to a greater extent when sealed by the sealing resin 7, and deflection of the bottom of the base plate 1 can be mended into a projecting shape. As shown in Table 1, deflection of the recessed base plate 1 was +0.08 mm, that is, the base plate 1 was deflected by 0.08 mm in a projecting direction. In this case, a stress to the ceramic portion was 204 MPa, and a stress to the solder joining portion was 224 MPa. In this manner, it is proved that, when the recessed base plate 1 is employed, the base plate 1 is deflected into a projecting shape and the deflected amount becomes smaller, and that a stress to both of the ceramic portion and the solder joining portion is reduced, as compared to the case of employing a flat base plate.

When the upper surface of the insulating substrate 4 is lower than the height of the upper surface of the base plate 1 while the insulating substrate 4 is disposed in the hollow portion 9 of the base plate 1, the amount of the sealing resin 7 present at the lateral sides of the insulating substrate 4 is reduced, and thus a stress to the insulating substrate 4 and the solder 8 can be reduced. Further, the height position from the bottom of the base plate 1 up to the insulating substrate 4 is lowered, which in turn lowers the height position of the power module 202 after assembly. This can contribute to downsizing of the power module 202.

The sealing resin 7, typically an epoxy resin, is cured at high temperature. When the temperature is brought back to room temperature subsequently to the curing, deflection of the base plate 1 shifts toward the projecting side due to linear expansion difference after cooling of the sealing resin 7. Accordingly, the force of restoring the deflection of the base plate 1 is larger as the linear expansion coefficient of the sealing resin 7 is larger. The deflection of the base plate 1 can be controlled by adjusting the linear expansion coefficient of the sealing resin 7 in accordance with the thickness of the base plate 1 and the depth of the hollow portion 9.

As described in the above, the power module 202 according to the first preferred embodiment includes the recessed base plate 1 having the hollow portion 9, the insulating substrate 4 disposed in the hollow portion 9 of the base plate 1, the semiconductor chip 5 mounted on the insulating substrate 4, and the sealing resin 7 for sealing a surface of the hollow portion 9 side of the base plate 1, the insulating substrate 4, and the semiconductor chip 5.

Consequently, deflection of the base plate 1 can be mended into a projecting shape, and therefore the deflected amount is less liable to be increased. With this, reliability and heat dissipation of the power module 202 can be improved.

Since the hollow portion 9 of the base plate 1 has a depth equal to or more than a half of the thickness of the insulating substrate 4, and equal to or more than ¼ of the thickness of the base plate 1, the amount of the sealing resin 7 present at the lateral sides of the insulating substrate 4 is reduced. With this, a stress to the insulating substrate 4 and the solder 8 can be reduced.

Since the material of the base plate 1 is copper, heat dissipation property of the power module 202 can be improved.

Since the linear expansion coefficient of the sealing resin 7 is $13 \times 10^{-6}/°$ C. or more, the three of restoring the deflection of the base plate 1 into a projecting direction is large when the temperature is brought back to room temperature subsequently to curing the sealing resin 7, thus allowing the deflection of the base plate 1 to be mended into a projecting shape. In addition, the effect of mending the deflection of the base plate 1 into a projecting shape becomes larger as the linear expansion coefficient of the sealing resin 7 is larger.

<Second Preferred Embodiment>

Figure 3:
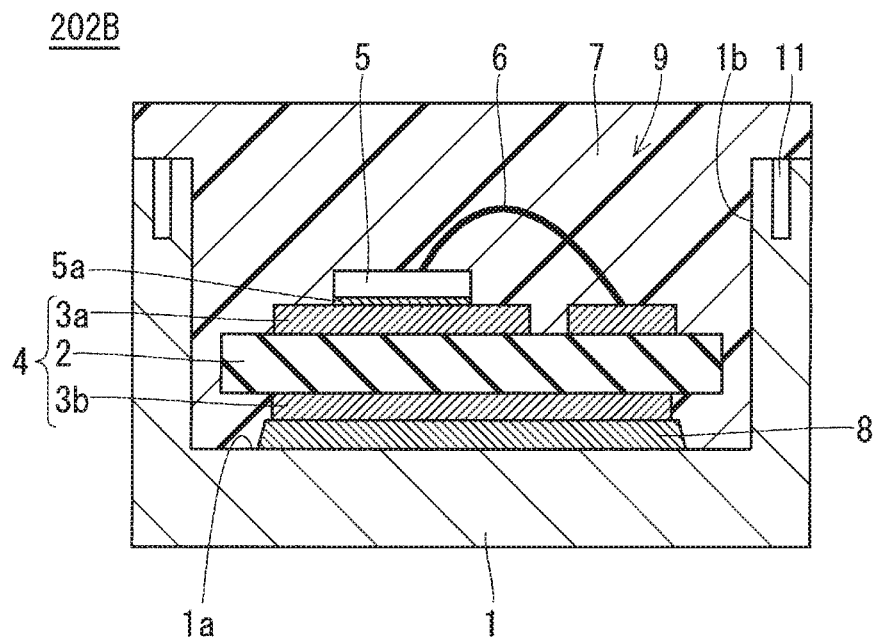
FIG. 3 is a cross-sectional view of a power module according to a second preferred embodiment.

Next, a power module 202B according to a second preferred embodiment will be described. FIG. 3 is a cross-sectional view of the power module 202B according to the second preferred embodiment. Note that, in the second preferred embodiment, the same reference symbols are given to the same components described in the first preferred embodiment, and the description thereof will be omitted.

As illustrated in FIG. 3, the power module 202B further includes a groove 11 formed in the outer peripheral portion of the base plate 1. The groove 11 is formed along the upper end portion and the entire outer peripheral portion of the base plate 1. That is, the groove 11 is formed in the base plate 1 at a position different from the position where the insulating substrate 4 is disposed.

Since the power module 202B further includes the groove 11 formed in the outer peripheral portion of the base plate 1, a bonding area between the base plate 1 and the sealing resin 7 is increased, which can improve bonding strength therebetween. Further, the groove 11 serves to lengthen an entry path through which moisture, a corrosive gas, or the like may enter the semiconductor chip 5 from the outside. Therefore, improvement in reliability of the power module 202B can be anticipated. In addition, the entry path is further lengthened as the groove 11 is further deepened. With this, the power module 202B becomes more resistant to moisture, a corrosive gas, or the like.

<Third Preferred Embodiment>

Figure 4:
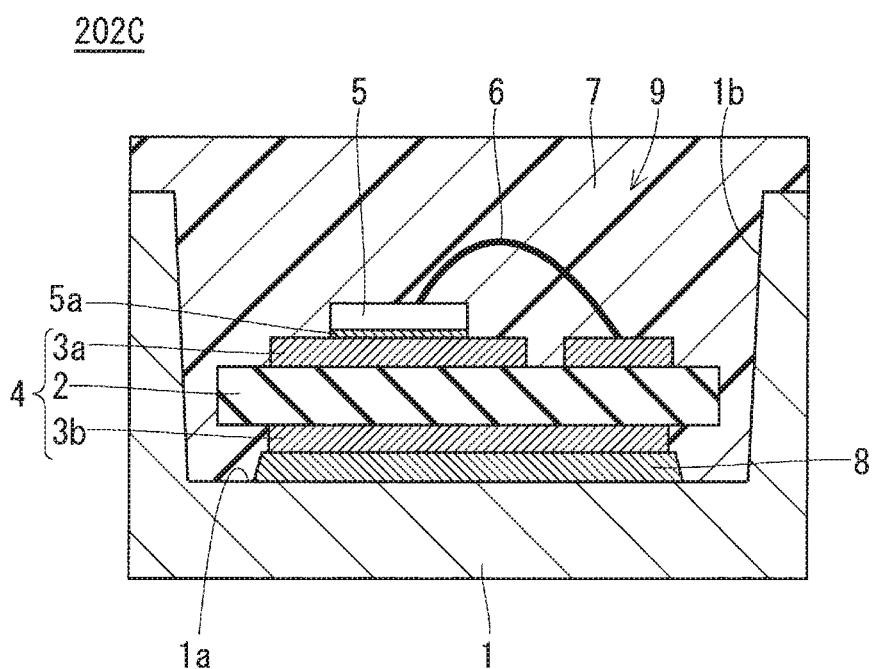
FIG. 4 is a cross-sectional view of a power module according to a third preferred embodiment.

Next, a power module 202C according to a third preferred embodiment will be described. FIG. 4 is a cross-sectional view of the power module 202C according to the third preferred embodiment. Note that, in the third preferred embodiment, the same reference symbols are given to the same components described in the first and second preferred embodiments, and the description thereof will be omitted.

As illustrated in FIG. 4, in the power module 202C, the side surface 1b of the hollow portion 9 is tapered with an upper end side slanted toward the outer peripheral side. That is, the outer peripheral portion of the base plate 1 is tapered with a narrowed upper end side. In the third preferred embodiment, pressing with use of a die or the like during the manufacture of the base plate 1 is assumed.

The tapered side surface 1b of the hollow portion 9 with an upper end side slanted toward the outer peripheral side improves removability when the base plate 1 is removed from a die after pressing. This can improve productivity of the base plate 1, and further can improve productivity of the power module 202C. Further, another effect can also be attained. That is, when the sealing resin 7 reaches the side surface 1b of the hollow portion 9 during sealing with the sealing resin 7, air bubbles are less liable to be generated even if the sealing resin 7 has high viscosity.

<Fourth Preferred Embodiment>

Figure 5:
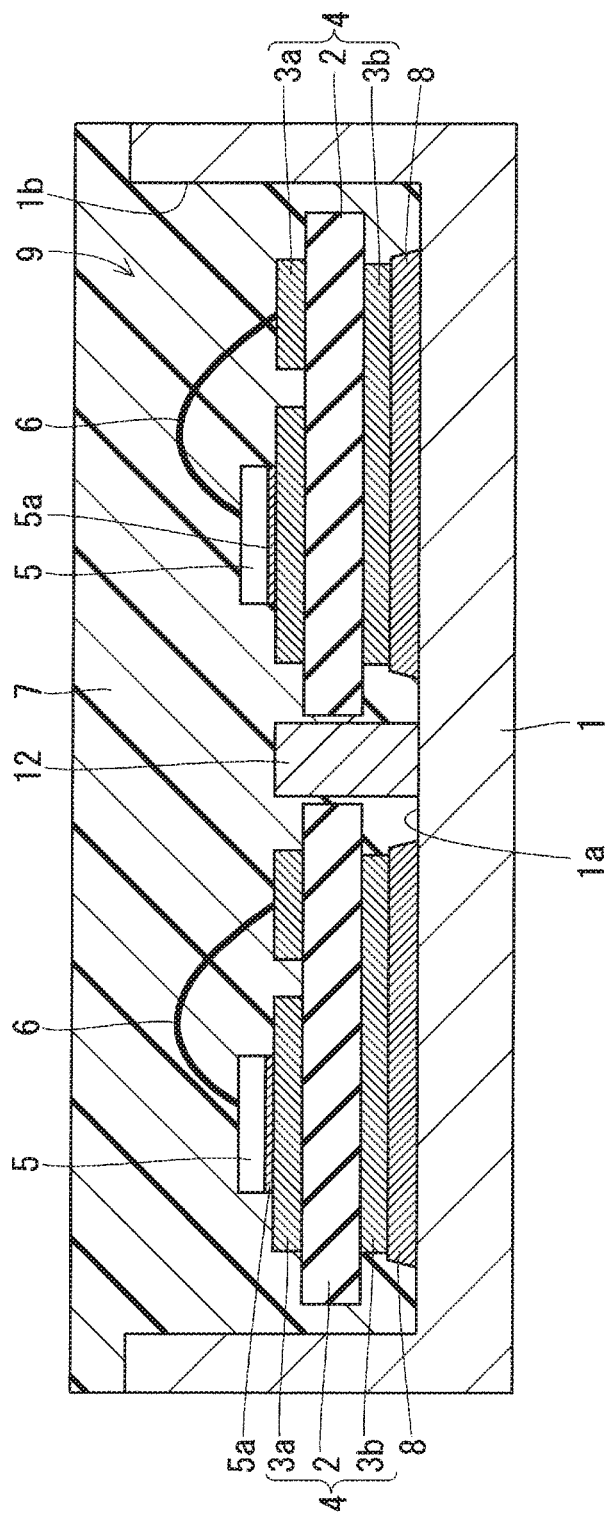
FIG. 5 is a cross-sectional view of a power module according to a fourth preferred embodiment.

Next, a power module 202D according to a fourth preferred embodiment will be described. FIG. 5 is a cross-sectional view of the power module 202D according to the fourth preferred embodiment. Note that, in the fourth preferred embodiment, the same reference symbols are given to the same components described in the first to third preferred embodiments, and the description thereof will be omitted.

As illustrated in FIG. 5, the power module 202D includes two insulating substrates 4, two semiconductor chips 5, and a projecting wall 12. Note that, it is only necessary that a plurality of insulating substrates 4 and a plurality of semiconductor chips 5 be provided. Three or more insulating substrates 4 and semiconductor chips 5 may be provided.

For example, the wall 12 is made of copper similarly to the base plate 1, and is disposed between adjacent insulating substrates 4 on the bottom surface 1a of the hollow portion 9. The height position of an upper end of the wall 12 is level with the height position of an upper end of each insulating substrate 4 or lower than the height position of an upper end of each insulating substrate 4.

Such a configuration is employed for the purpose of securing an insulation distance between the wires 6 and the base plate 1 when wiring is performed on the insulating substrates 4 with the wires 6. In the fourth preferred embodiment, the wall 12 serves to reduce the amount of the sealing resin 7 present between the adjacent insulating substrates 4. Therefore, a stress to each insulating substrate 4 and each solder 8 can be further reduced.

<Fifth Preferred Embodiment>

In this preferred embodiment, the power module 202 according to the first preferred embodiment described above is used in a power convertor. The present invention is not limited to a specific power convertor. As a fifth preferred embodiment, the following description is given of a case where the present invention is applied to a three-phase inverter, FIG. 6 is a block diagram illustrating a configuration of a power converting system using a power convertor according to the fifth preferred embodiment.

Figure 6:
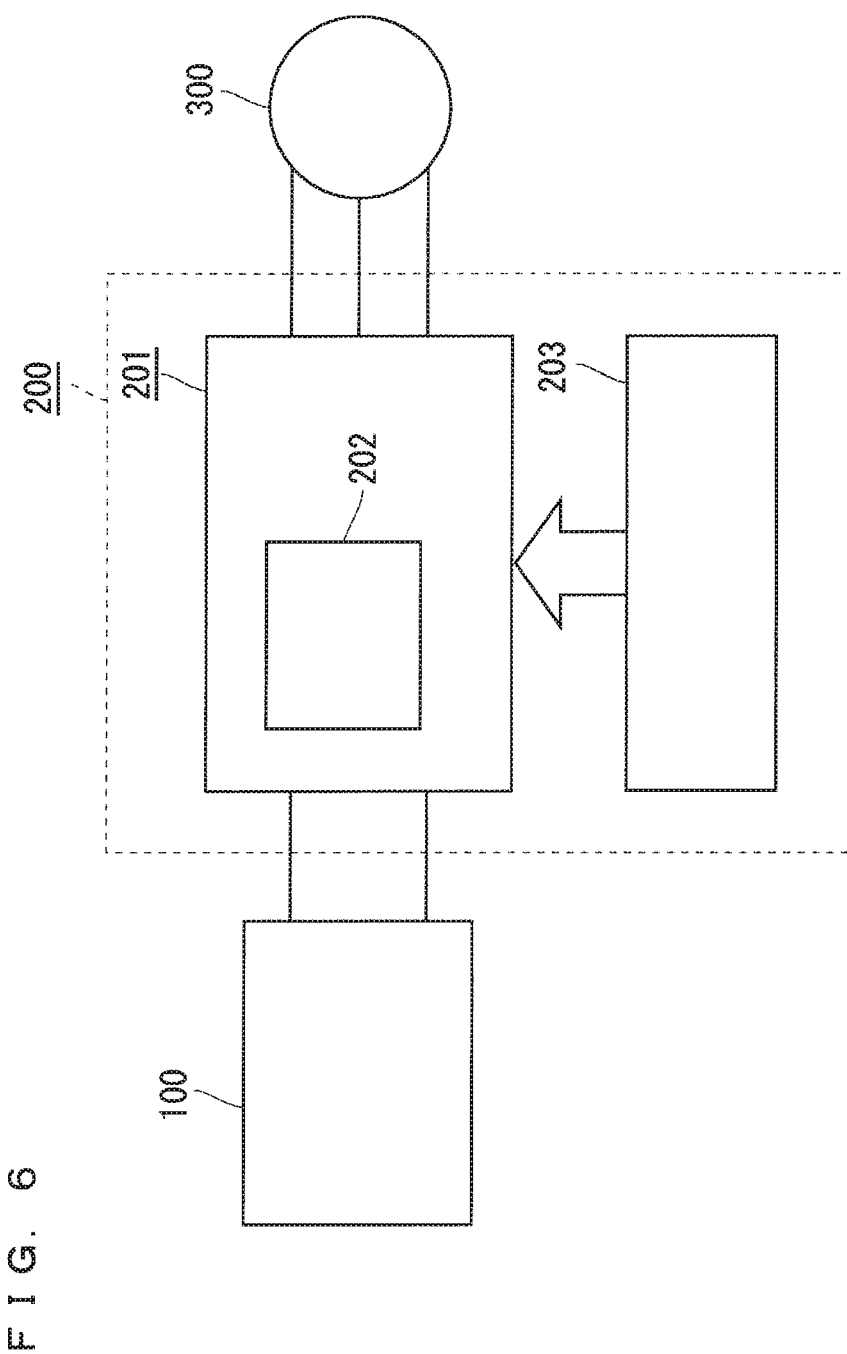
FIG. 6 is a block diagram illustrating a configuration of a power converting system using a power convertor according to a fifth preferred embodiment.

The power converting system illustrated in FIG. 6 includes a power supply 100, a power convertor 200, and a load 300. The power supply 100 is a DC power supply, and supplies DC power to the power convertor 200. The power supply 100 may be formed of various members. For example, the power supply 100 may be formed of a DC system, a solar cell, or a storage battery, or formed of a rectifier circuit or an AC/DC converter connected to an AC system. Further, the power supply 100 may be formed of a DC/DC converter that converts DC power output from a DC system into predetermine power.

The power convertor 200 is a three-phase inverter connected between the power supply 100 and the load 300, and converts DC power supplied from the power supply 100 into AC power to supply the AC power to the load 300. As illustrated in FIG. 6, the power convertor 200 includes a main converter circuit 201 that converts DC power into AC power to output the AC power, and a control circuit 203 that outputs a control signal for controlling the main converter circuit 201 into the main converter circuit 201.

The load 300 is a three-phase electric motor that is driven by AC power supplied from the power convertor 200. Note that, the load 300 is not limited to a specific purpose. The load 300 is an electric motor mounted in various electrical devices, and is used as an electric motor for a hybrid automobile, an electric automobile, a railway vehicle, an elevator, or an air conditioner, for example.

Now, detailed description is given of the power convertor 200. The main converter circuit 201 includes a switching element and a freewheeling diode (not shown), and converts, through switching of the switching element, DC power supplied from the power supply 100 into AC power to supply the AC power to the load 300. Although there are various specific circuit configurations for the main converter circuit 201, the main converter circuit 201 according to this preferred embodiment is a two-level three-phase full bridge circuit, which can include six switching elements and six freewheeling diodes that are connected in anti-parallel with the respective switching elements. Each switching element and each freewheeling diode of the main converter circuit 201 are formed using the power module according to any one of the above first to fourth preferred embodiments. Note that, description is herein given of a case of using the power module 202 according to the first preferred embodiment. Every two switching elements of the six switching elements are connected in series to form upper and lower arms, and the upper and lower arms form respective phases (U-phase, V-phase, and W-phase) of the full bridge circuit. Output terminals of the upper and lower arms, i.e., three output terminals of the main converter circuit 201, are connected to the load 300.

Further, the main converter circuit 201 includes a drive circuit (not shown) that drives each switching element. The drive circuit may be incorporated into the power module 202, or may be provided separately from the power module 202. The drive circuit produces a drive signal for driving the switching element of the main converter circuit 201, and supplies the drive signal to a control electrode of the switching element of the main converter circuit 201. Specifically, a drive signal for turning on the switching element and a drive signal for turning off the switching element are output to the control electrode of each switching element in accordance with a control signal from the control circuit 203 described below. When the switching element is kept turned on, the drive signal is a voltage signal (on-signal) of a threshold voltage of the switching element or higher. When the switching element is kept turned off, the drive signal is a voltage signal (off-signal) of a threshold voltage of the switching element or lower.

The control circuit 203 controls the switching element of the main converter circuit 201 such that desired power is supplied to the load 300. Specifically, time (on-time) at which each switching element of the main converter circuit 201 has to be turned on is calculated based on power required to be supplied to the load 300. For example, the main converter circuit 201 can be controlled with PWM control, whereby the on-time for the switching element is modulated in accordance with the voltage required to be output. Then, a control command (control signal) is output to the drive circuit of the main converter circuit 201 such that an on-signal is output to the switching element required to be turned on and that an off-signal is output to the switching element required to be turned off at their respective times. In accordance with the control signals, the drive circuit outputs the on-signal or the off-signal as the drive signal to the control electrode of each switching element.

In the power convertor according to this preferred embodiment, the power module 202 according to the first preferred embodiment is used as the switching element and the freewheeling diode of the main converter circuit 201. Therefore, reliability can be improved.

In this preferred embodiment, description has been given of a case where the present invention is applied to a two-level three-phase inverter. The present invention, however, is not only limited thereto, and may be applied to various power convertors. Although a two-level power convertor is used in this preferred embodiment, a three-level or multi-level power convertor may be used. Alternatively, the present invention may be applied to a single-phase inverter if power is to be supplied to a single-phase load.

Further, the present invention may also be applied to a DC/DC converter or an AC/DC converter if power is to be supplied to a DC load or the like.

Further, the power convertor to which the present invention is applied is not limited to a case where the above-mentioned load is an electric motor. For example, the power convertor to which the present invention is applied may be used as a power supply device for an electric discharge machine, a laser beam machine, an induction heating cooking device, and a non-contact power supply system, as well as a power conditioner for a photovoltaic generation system, a power storage system, or the like.

Note that, in the present invention, each of the preferred embodiments may be freely combined, and each of the preferred embodiments may be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power module comprising:
   a recessed base plate having a hollow portion, the hollow portion of the base plate has a bottom surface and a side surface, the side surface of the hollow portion is tapered with an upper end side slanted at an angle toward an outer peripheral side, and an outer peripheral portion of the base plate is tapered with a narrowed upper end side;
   at least one insulating substrate disposed in the hollow portion of the base plate;
   at least one semiconductor chip mounted on the at least one insulating substrate; and
   a sealing resin for sealing a surface of the hollow portion side of the base plate, the at least one insulating substrate, and the at least one semiconductor chip, the sealing resin directly contacting and adhering to an inner surface of the recessed based plate defining the hollow portion.

2. The power module according to claim 1, wherein
   the hollow portion of the base plate has a depth equal to or more than a half of a thickness of the at least one insulating substrate, and equal to or more than ¼ of a thickness of the base plate.

3. The power module according to claim 1, further comprising
   a groove formed in an outer peripheral portion of the base plate.

4. The power module according to claim 1, wherein
   the at least one insulating substrate comprises a plurality of the insulating substrates,
   the at least one semiconductor chip comprises a plurality of the semiconductor chips,
   the plurality of the semiconductor chips are mounted on the respective plurality of the insulating substrates,
   the power module further comprises a wall disposed between adjacent insulating substrates of the plurality of the insulating substrates, and
   a height position of an upper end of the wall is level with a height position of an upper end of each of the plurality of the insulating substrates or lower than a height position of an upper end of each of the plurality of the insulating substrates.

5. The power module according to claim 1, wherein
   a material of the base plate comprises copper.

6. The power module according to claim 1, wherein
   a linear expansion coefficient of the sealing resin is $13 \times 10^{-6}/°$ C. or more.

7. A power convertor comprising:
   a main converter circuit comprising the power module of claim 1, the main converter circuit being configured to convert incoming power and output the converted power; and
   a control circuit configured to output a control signal for controlling the main converter circuit into the main converter circuit.

8. A power module comprising:
   a recessed base plate having a hollow portion, and a groove formed in an outer peripheral portion of the base plate;
   at least one insulating substrate disposed in the hollow portion of the base plate;
   at least one semiconductor chip mounted on the at least one insulating substrate; and
   a sealing resin for sealing a surface of the hollow portion side of the base plate, the at least one insulating substrate, and the at least one semiconductor chip.

9. The power module according to claim 8, wherein the sealing resin directly contacts and adheres to an inner surface of the recessed base plate defining the hollow portion.

10. A power module comprising:
a recessed base plate having a hollow portion;
a plurality of insulating substrates disposed in the hollow portion of the base plate;
a plurality of semiconductor chips mounted on the respective plurality of the insulating substrates;
a sealing resin for sealing a surface of the hollow portion side of the base plate, the insulating substrates, and the semiconductor chips; and
a wall disposed between adjacent insulating substrates of the plurality of the insulating substrates, and
a height position of an upper end of the wall is level with a height position of an upper end of each of the plurality of the insulating substrates or lower than a height position of an upper end of each of the plurality of the insulating substrates.

11. The power module according to claim 10, wherein the sealing resin directly contacts and adheres to an inner surface of the recessed base plate defining the hollow portion.

12. A power convertor comprising:
a main converter circuit comprising a power module comprising:
a recessed base plate having a hollow portion;
at least one insulating substrate disposed in the hollow portion of the base plate;
at least one semiconductor chip mounted on the at least one insulating substrate; and
a sealing resin for sealing a surface of the hollow portion side of the base plate, the at least one insulating substrate, and the at least one semiconductor chip,
the main converter circuit being configured to convert incoming power and output the converted power; and
a control circuit configured to output a control signal for controlling the main converter circuit into the main converter circuit.

13. The power convertor according to claim 12, wherein the sealing resin directly contacts and adheres to an inner surface of the recessed base plate defining the hollow portion.

* * * * *